(12) United States Patent
Schauwecker et al.

(10) Patent No.: US 6,781,494 B2
(45) Date of Patent: Aug. 24, 2004

(54) ACTIVELY SHIELDED SUPERCONDUCTING MAGNET ASSEMBLY WITH A DEVICE FOR ADDITIONAL FRINGE FIELD OPTIMIZATION

(75) Inventors: Robert Schauwecker, Zurich (CH); Andreas Amann, Zurich (CH); Pierre-Alain Bovier, Zurich (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 10/456,775

(22) Filed: Jun. 9, 2003

(65) Prior Publication Data
US 2003/0236170 A1 Dec. 25, 2003

(30) Foreign Application Priority Data
Jun. 22, 2002 (DE) ......................... 102 27 877

(51) Int. Cl.⁷ .............. H01F 6/00; H01F 7/00
(52) U.S. Cl. ............ 335/299; 335/216; 335/301
(58) Field of Search ........... 335/216, 296–301; 324/318–320

(56) References Cited

U.S. PATENT DOCUMENTS

| | | | |
|---|---|---|---|
| 5,329,266 A | * | 7/1994 | Soeldner et al. ............ 335/216 |
| 6,265,960 B1 | | 7/2001 | Schauwecker et al. |
| 6,369,464 B1 | * | 4/2002 | Schauwecker et al. ........ 307/91 |
| 6,489,872 B1 | * | 12/2002 | Fukushima et al. ......... 335/299 |

FOREIGN PATENT DOCUMENTS

| | | |
|---|---|---|
| EP | 0 468 425 | 1/1992 |
| WO | WO 00/52 490 | 9/2000 |

* cited by examiner

Primary Examiner—Tuyen T. Nguyen
(74) Attorney, Agent, or Firm—Paul Vincent

(57) ABSTRACT

A magnet assembly for generating a magnetic field (H) in the direction of a z axis in a working volume (AV) comprises an actively shielded superconducting magnet coil system (M) and at least one current path (P1, . . . , Pn) which is superconductingly closed in the operating state. The actively shielded superconducting magnet coil system (M) has a radially inner partial coil system (C1) and a radially outer partial coil system (C2) disposed coaxially with respect to each other. An external device supplies current to the current paths (P1, . . . , Pn) to charge each path to a respective current (IP1, . . . , IPn) in the operating state. When optimizing the fringe field behavior outside of the magnet system, the overall magnitude of magnetic dipole moments of the current paths (P1, . . . , Pn), charged to their respective operating currents (IP1, . . . , IPn), is at least 0.1% of the magnitude of the magnetic dipole moment of the charged partial coil system (C2). When charging the current paths (P1, . . . ,Pn) to their respective operating current (IP1, . . . , IPn), the resulting change $\Delta_{H2}$ of the coefficient of second order (H2) of the polynomial expansion of the magnetic field (H) of the magnet assembly is given by: $|\Delta_{H2}|<\max(0.25T/m^2, 0.9\cdot|H2(M)|)$, wherein H2(M) designates the coefficient of second order of the polynomial expansion of the magnetic field of the actively shielded superconducting magnet coil system (M) in the operating state. This permits compensation for deviations of the fringe field of the magnet assembly from its design values due to deviations of coil parameters from their design values, through an appropriate design of the additional current paths (P1, . . . , Pn) and setting their currents to a suitable value.

12 Claims, 2 Drawing Sheets

ACTIVELY SHIELDED SUPERCONDUCTING MAGNET ASSEMBLY WITH A DEVICE FOR ADDITIONAL FRINGE FIELD OPTIMIZATION

This application claims Paris Convention priority of DE 102 27 877.6 filed Jun. 22, 2002 the complete disclosure of which is hereby incorporated by reference.

BACKGROUND OF THE INVENTION

The invention concerns a magnet assembly for generating a magnetic field in the direction of a z axis in a working volume disposed on the z axis about z=0 with an actively shielded superconducting magnet coil system and at least one current path which is superconductingly closed in the operating state, wherein the actively shielded superconducting magnet coil system comprises a radially inner and a radially outer partial coil system which are disposed coaxially to each other and whose magnetic dipole moments have opposite signs in the operating state which differ by an amount of $\Delta_m$ with $|\Delta_m|<2.5\%$ of the magnetic dipole moment magnitude of the radially inner partial coil system, wherein the magnetic field of the magnet assembly can be expanded along the z axis about z=0 in a polynomial in z having the coefficients Hn and wherein the magnet assembly has an external device for charging the superconductingly closed current paths with an operating current in the operating state and wherein the overall contribution of the superconductingly closed current paths to the magnetic field of the magnet assembly in the working volume of the magnet assembly in the operating state is smaller than 5% of the field contribution of the actively shielded superconducting magnet coil system.

A magnet assembly of this type comprising an actively shielded magnet coil system and at least one additional superconductingly closed current path is disclosed in the patent document U.S. Pat. No. 6,265,960. In this magnet assembly, an additional, superconductingly closed current path acts as superconducting shim device to improve the field homogeneity in the working volume of the magnet assembly.

Patent document WO 00/52490 discloses a further magnet assembly comprising an actively shielded magnet coil system and at least one additional superconductingly closed current path. This magnet assembly comprises an additional superconductingly closed current path for compensating external electromagnetic disturbances, for compensating a field drift caused by the magnet coil system itself, or for fine adjustment of the magnetic field strength in the working volume.

Superconducting magnets have various fields of application which include high-field applications, e.g. for magnetic resonance methods. Such high-field magnets also typically generate a large fringe field. This fringe field can represent a danger for the surroundings of the magnet. This problem can be solved when the magnet comprises an active shielding, i.e. an additional superconducting coil which is connected in series with the main coil of the magnet but which generates a field of opposite polarity.

In particular magnets with highly efficient fringe field shielding pose the problem that deviations from the design specifications for the magnet coils may cause considerable changes in the fringe field generated by the magnet assembly such that required fringe field specifications are not met. Small deviations from the design specifications due to production tolerances are unavoidable. For example, the wire diameters may have tolerances of up to one percent. Such small deviations can dramatically deteriorate the fringe field values since large field contributions with different signs are mutually superposed for compensating the fringe field outside of the magnet assembly. At a location where a fringe field of 0.5 mT should result, the mutually compensating amounts of main coil and fringe field shielding are e.g. in an order of magnitude of 100 mT. A deviation of one of these two field contributions from its desired value by approximately 1% caused by the production inaccuracies in the coil system produces a deviation of the fringe field strength from the desired value of approximately 1 mT at the location of the 0.5 mT contour surface. The required fringe field limit at this location could thereby be exceeded; in this case by multiple factors.

It is the underlying purpose of the present invention to improve a conventional magnet assembly such that its fringe field boundary values are maintained even when individual parameters of the coil arrangement differ from the desired values in consequence of production inaccuracies. In particular, fringe field effects from deviations in the winding data from their desired values and due to geometrical deviations in the coil formers carrying the individual coil systems from their desired geometry, shall be compensated for.

SUMMARY OF THE INVENTION

This object is achieved in accordance with the invention in that the magnet assembly comprises at least one additional superconducting current path, which can be charged independently of the actively shielded magnet coil system. To permit improvement of the fringe field of the magnet assembly by the additional current paths without negative side effects on the function of the magnet assembly, the dimensioning of these current paths must meet various requirements. The field contribution generated by the additional current paths in the working volume of the magnet assembly should not exceed 5% of the field contribution value of the actively shielded superconducting magnet coil system. Moreover, it should be ensured that the currents flowing in the additional current paths do not substantially deteriorate the homogeneity of the magnetic field of the magnet assembly in the working volume. Since the homogeneity of the magnet assembly is mainly determined by the coefficient of second order in the polynomial expansion of the magnetic field about the center, the contribution of the additional current paths to the coefficient of second order of the overall field of the magnet assembly should be small compared with the corresponding coefficient of the actively shielded superconducting magnet coil system and/or not exceed an absolute maximum value of $0.25T/m^2$. These conditions are also at least partially met by additional superconductingly closed current paths in accordance with the cited prior art.

In one inventive embodiment of the additional, superconductingly closed current path, one ensures that the area enclosed by its windings is large enough that the currents flowing therein generate a sufficiently large fringe field contribution, in particular a sufficiently large magnetic dipole moment. In this manner, suitable selection of the currents flowing in the individual additional current paths in the operating state of the configuration can at least partly compensate for a deviation of the magnetic dipole moment of the actively shielded magnet coil system from its desired value caused by production tolerances via the dipole moment of the currents flowing in the additional superconductingly short-circuited current paths without substantially deteriorating other properties of the magnetic field of the overall configuration by field contributions of the additional superconductingly short-circuited current path or paths.

The inventive configuration is advantageous in that even for very well actively shielded superconducting magnet systems whose fringe field reacts excessively to deviations in the design parameters of the magnet coil arrangement from their desired values, the theoretically achievable fringe field limits can be kept without having to take expensive and demanding measures during production to prevent such deviations from the design specifications. This permits more economical manufacture requiring no additional measures for precise production tolerances in the winding data in accordance with design specifications, such that wires and coil formers having precise tolerances are not required. One particular advantage of the inventive configuration is that it can prevent excessive fringe field values caused by deviations of various design parameters of the actively shielded magnet coil system from their desired values without having to calculate and construct a special configuration for each individual parameter.

In a particularly advantageous inventive magnet assembly, the magnetic dipole moments of the partial coil systems of the actively shielded magnet coil system differ by less than 1% of the magnetic dipole moment of the radially inner partial coil system. In this case, the production tolerance related deviations of the dipole moments of the two partial coil systems of the actively shielded magnet coil system are particularly large relative to the overall dipole moment of the magnet coil system. This produces large deviations in the overall dipole moment of the magnet coil system from its theoretical value even for small deviations in the design parameters of the partial coil systems from their desired values. It is therefore advantageous, in particular for such actively shielded magnet coil systems, to provide an inventive device in the form of additional superconductingly short-circuited current paths for compensating deviations of the fringe field of the magnet coil system from its desired value.

One embodiment of the inventive magnet assembly is also particularly advantageous with which the magnet assembly is part of an apparatus for high-resolution magnetic resonance spectroscopy. The radially inner partial coil system of such magnet assemblies generally has a very large dipole moment due to the high field strengths required for such apparatus, and therefore the use of actively shielded magnet systems is particularly advantageous. The inventive configuration ensures that production deviations of the magnet coil system from its design specifications do not result in excessive fringe fields as would be particularly undesirable in this case due to the usual large dipole moments.

One embodiment of the inventive magnet assembly is particularly preferred in which the magnet assembly comprises a further superconducting coil system which serves as superconducting Z2 shim for the magnet assembly and whose contribution to the magnetic field of the magnet assembly largely eliminates the coefficient of second order of the polynomial expansion of the magnetic field of the magnet assembly in the operating state. Deterioration of the field homogeneity of the magnet assembly which may be caused by somewhat inhomogeneous field contributions from the additional superconductingly closed current paths can at least be partially compensated for by providing the magnet assembly with an additional Z2 shim. In this manner, the additional current paths only effect a change in the external fringe field but do not cause deterioration in the field homogeneity at the center of the magnet assembly.

In one particularly preferred embodiment of the inventive magnet assembly, at least one of the additional superconductingly short-circuited current paths is inductively decoupled from the overall magnet coil system. An inductive coupling between the magnet coil system and a superconductingly short-circuited current path would require its switch to be regularly opened during charging to prevent undesired inductive charging of that current path. In the preferred embodiment configuration, no current change is induced in the actively shielded magnet coil system even during charging of the additional current paths to their respective operating current and an undesired field shift in the working volume is thereby avoided.

In a further advantageous embodiment of the inventive magnet assembly, at least one of the additional superconductingly short-circuited current paths is part of a device, which provides the magnet assembly with additional functionality. In particular, that current path serves for compensating external magnetic field fluctuations. This embodiment is advantageous since this double functionality makes the overall magnet assembly more compact.

In a further particularly preferred embodiment of the inventive magnet assembly, at least one of the additional superconductingly short-circuited current paths is thermally decoupled from the actively shielded magnet coil system. In the event of a quench in the magnet coil system, the amount of heat transferred to this additional current path is thereby, at least initially, too small to trigger a quench in the additional current path. This is important since the current induced in the additional, still superconducting, current path due to the change in the magnetic flux during the initial phase of the quench of the magnet coil system, is needed in order to keep the fringe field of the magnet assembly small, even during a quench.

One embodiment of the inventive magnet assembly is particularly preferred wherein at least one of the additional superconductingly closed current paths has magnet coils of a radius which is at least 90% of the radius of the outermost coils of the actively shielded superconducting magnet coil system. Since this current path surrounds a large surface, it generates a considerable magnetic dipole moment without requiring a large current. This is advantageous since the maximum current, which flows in this current path, can be easily kept below the critical current above which the superconductivity would break down.

One further advantageous embodiment of the inventive magnet assembly is characterized in that at least one of the additional superconductingly closed current paths comprises coils which are wound on a coil former which also serves as a carrier for coils of the outer partial coil system of the actively shielded superconducting magnet coil system. This additional current path thereby surrounds a large surface and therefore requires only a small amount of current to generate a magnetic dipole moment, which has sufficient influence on the fringe field. The production of the magnet assembly is less expensive, since no additional coil former is required for the additional current path.

One particularly preferred embodiment of the inventive magnet assembly is characterized in that the overall contribution of the additional superconductingly closed current paths to the magnetic field of the magnet assembly in the working volume of the magnet assembly in the operating state is negligibly small. This advantageously permits simplified installation of the system to obtain the desired field in the working volume and an optimum fringe field outside of the magnet assembly. Setting the currents in the additional current paths does not lead to considerable change in the field magnitude within the working volume.

In one further advantageous embodiment of the inventive magnet assembly, at least one of the additional superconductingly closed current paths generates an asymmetrical magnetic field in the operating state relative to a plane perpendicular to the z axis and intersecting same at z=0. This embodiment permits correction of deviations in the fringe field of the magnet assembly from its desired behavior, which are asymmetrical relative to this plane. Fringe field distortions of this type can be caused e.g. by superconducting shim coils in the magnet assembly if the shim coils produce a field contribution which can be expanded along the z-axis about z=0 in a polynomial in z with uneven coefficients Hn.

Further advantages of the invention can be extracted from the description and the drawing. The features mentioned above and below may be used in accordance with the invention either individually or collectively in arbitrary combination. The embodiments shown and described are not to be understood as exhaustive enumeration but rather have exemplary character for describing the invention.

The invention is shown in the drawing and is explained in more detail with reference to embodiments.

DESCRIPTION OF THE PREFERRED EMBODIMENT

Figure 1:
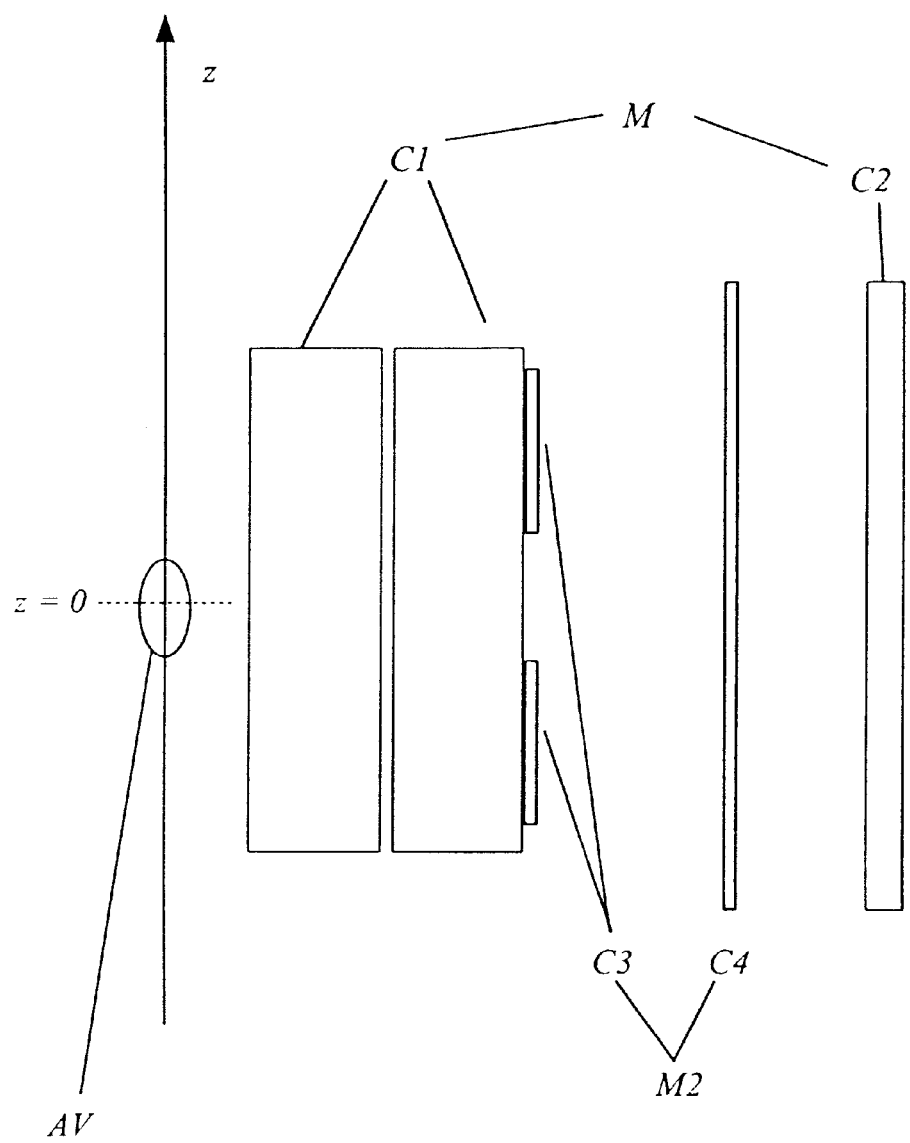
FIG. 1 shows a schematic vertical section through a radial half of an inventive magnet assembly.

FIG. 1 shows an inventive magnet assembly disposed about a working volume AV and comprising an actively shielded superconducting magnet coil system M with a radially inner and a radially outer coaxial partial coil system C1 and C2 and an additional superconductingly closed current path P1 in the form of a further magnet coil system M2 with two superconducting partial coil systems C3 and C4.

Figure 2:
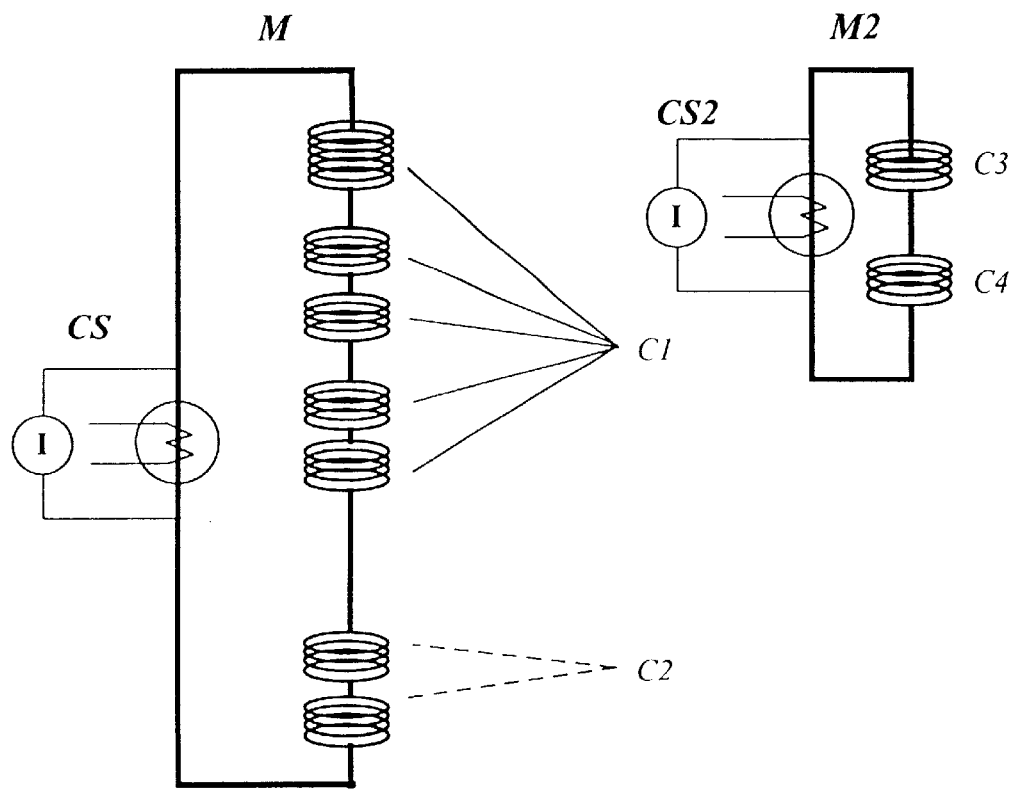
FIG. 2 shows a wiring diagram of an inventive magnet assembly.

FIG. 2 schematically shows the wiring of an inventive magnet assembly, in particular of an additional superconductingly closed current path P1 comprising current supply CS2 in the embodiment of an additional coil system M2, which is separate from the actively shielded superconducting magnet coil system M and comprises two superconducting partial coil systems C3 and C4. The magnet coil systems M and M2 may be charged to mutually independent operating currents via current supplies CS or CS2.

The invention is explained below by means of two embodiments of a magnet assembly with an actively shielded superconducting magnet coil system which each generate a magnetic field in the working volume AV having a strength of 9T. Niobium-titanium is used as superconducting material. The magnet assembly is operated in a liquid helium bath at a temperature of 4.2K.

The first magnet assembly (called embodiment "V1" below) comprises an actively shielded superconducting magnet coil system M in accordance with prior art. A radially inner partial coil system C1 and a radially outer partial coil system C2 are part of this magnet coil system. C1 thereby consists of two concentric and coaxial solenoid coils C1$a$ and C1$b$ that are directly wound on each other and have equal polarities and C2 consists of one single solenoid coil, which is disposed concentrically and coaxially to C1 with a polarity opposite to C1. The operating current for this magnet coil system is 81.7A. The clear inner bore has a diameter of 70 mm.

An inventive variant (referred to as "V2" below) is compared with variant V1 which has, in addition to the magnet coil system M an additional superconductingly closed current path P1 in the form of a further coil system M2 with two superconducting partial coil systems C3 and C4 connected in series. In the present example, the magnet coil system M is identical with that of variant V1. C3 consists of a Helmholtz coil, which is directly wound on the outermost layer of C2, and C4 consists of a further solenoid coil disposed radially between the two partial coil systems C1 and C2.

Table 1 shows the most important features of the coil systems C1 (C1$a$ and C1$b$) and C2 as well as C3 and C4.

TABLE 1

|  | C1a | C1b | C2 | C3 | C4 |
|---|---|---|---|---|---|
| ri [mm] | 38.0 | 58.5 | 222.0 | 102.2 | 147.5 |
| ra [mm] | 58.5 | 102.2 | 225.4 | 106.8 | 149.8 |
| L [mm] | 380 | 380 | 450 | 63.3 | 450 |
| C [mm] | 0 | 0 | 0 | ±55.8 | 0 |
| W | 361 | 468 | 698 | 98 | 698 |
| N | 26 | 62 | 6 | 8 | 4 |
| m* [m²] | 673.4 | | −658.7 | −53.9 | 193.9 |
| | | 14.7 | | | 140.0 |

In Table 1:
ri inner radius of the coil,
ra outer radius of the coil,
L length of the solenoid coil or partial coil of the Helmholtz coil,
C axial position of the center of the solenoid coil or a partial coil of the Helmholtz coil,
W the number of wire windings on each layer of the solenoid coil or a partial coil of the Helmholtz coil,
N the number of wire layers of the solenoid coil or of the Helmholtz coil,
m* the magnetic dipole moment per ampere current.

The additional current path P1 is inductively decoupled from the magnet coil system M and generates neither a change in the field contribution nor in the coefficient of second order H2 of the polynomial expansion of the magnetic field at the center of the magnet assembly. One ampere of current in the additional current path P1 only generates a negligible change $\Delta H0=9.2 \cdot 10^{-6}$T in the magnetic field and $\Delta H2=-1.7 \cdot 10^{-4}$T/m² for the second order coefficient.

The influence of deviations in the individual magnet coils from the design specifications on the fringe field of the configuration in the operating state is calculated below for the magnet assemblies V1 or V2. An example for a possible deviation of a design parameter from its desired value is herein an increase in the wire windings of the partial coil system C2 compared to the theoretical value due to a superconducting wire with smaller diameter than its desired value.

The magnet coil system M has a fringe field which can be characterized e.g. by the maximum extension of the 0.5 mT contour surface. In an embodiment of the magnet coil system M in accordance with the design specifications, this extension is 0.63 m in a radial and 1.09 m in an axial direction. The use of a wire in the partial coil system C2 whose diameter is smaller than the specified values by 4% causes this partial coil system to have 727 instead of 698 windings per layer and considerably increases the radial extension of the 0.5 mT contour surface for variant V1. Charging of the additional current path P1 with a current of 19.2A in the inventive magnet assembly V2 theoretically largely compensates for the deviation of the fringe field from the desired value taking into consideration the actual winding numbers. A further possibility to determine the optimum current in the current path P1 would be measuring the fringe field of the magnet and determine the required compensation current experimentally.

Table 2 shows the resulting dipole moments in the operating state and the dimensions of the 0.5 mT contour surface for the two embodiments V1 and V2 in accordance with the design specifications and for a wire, which is 4% too thin in the partial coil system C2.

TABLE 2

|  | According to design | Deviations from winding in C2 | |
| --- | --- | --- | --- |
|  | V1 & V2 | V1 | V2 |
| IP1 [A] | 0 | — | 19.2 |
| R5G [m] | 0.63 | 0.80 | 0.63 |
| Z5G [m] | 1.09 | 0.92 | 1.14 |
| B63 [mT] | 0.50 | 1.26 | 0.49 |
| $m_{c1}$ [Am$^2$] | 55051 | 55225 | 55225 |
| $m_{c2}$ [Am$^2$] | −53850 | −56236 | −56236 |
| $m_M$ [Am$^2$] | 1201 | −1011 | −1011 |
| $m_{p1}$ [Am$^2$] | 0 | — | 2687 |

In Table 2:

IP1 the current flowing in the additional current path P1,

R5G maximum extension of the 0.5 mT contour surface in a radial direction, measured from the magnet axis, Z5G maximum extension of the 0.5 mT contour surface in an axial direction, measured from the magnet center plane, B63 maximum magnitude of the field strength of the magnet assembly on a cylindrical surface coaxial with the magnet coil system having a radius of 0.63 m, $m_{C1}$ magnetic dipole moment of the partial coil system C1 in the operating state, $m_{C2}$ magnetic dipole moment of the partial coil system C2 in the operating state, $m_M$ magnetic dipole moment of the magnet coil system M in the operating state, $m_{P1}$ magnetic dipole moment of the additional current path P1 in the operating state.

As can be seen from the values of table 2, the deviation of the winding data from the design specifications causes a clear change in the magnetic dipole moment of the partial coil system C2. This change is largely compensated for in the inventive embodiment V2 by the magnetic dipole moment, which is generated by the current fed in the additional current path P1 to generate a fringe field, which is practically identical to the design field. Table 2 also shows that a magnet coil system M that is optimized with regard to the minimum radial extension of the 0.5 mT contour surface does not have a minimum magnetic dipole moment. For the assumed winding number deviations in the partial coil system C2, variant V1 obtains a smaller magnetic dipole moment than according to the design specifications. However, the extension of the 0.5 mT contour surface in a radial direction is considerably larger than the design specifications. In the inventive embodiment V2, the current fed in the additional current path P1 minimizes the radial extension of the 0.5 mT contour surface, although the magnitude of the resulting total dipole moment thereby increases.

The region inside the R5G distance from the magnet axis must typically be kept free from magnetic materials and from devices, which are sensitive to magnetic fields. This distance is 0.63 m for a configuration in accordance with the design specifications. For this reason, it is crucial that the field strength of 0.5 mT is not exceeded at this distance from the magnet axis even when individual coil parameters have values, which differ from the desired value. This requirement is not met in the embodiment V1. The fringe field may rise at a distance of 0.63 m from the magnet axis up to twice the design value of 0.5 mT and the threshold value of 0.5 mT is only achieved beyond a distance from the magnet axis of 0.80 m. In contrast thereto, the inventive variant V2 shows no fringe field increase compared to the design values.

The fringe field of the magnet coil system M in the above example is optimized with regard to minimum radial extension of the 0.5 mT contour surface. Due to production deviations of individual coil parameters from their design specifications, the embodiment of the magnet assembly from the above-mentioned example according to prior art, shows a reduction in the axial extension of the 0.5 mT contour surface relative to the desired value. This is always accompanied by an increase of the radial extension of the 0.5 mT contour surface (shown in the example of table 2). In an inventive embodiment of the magnet assembly, the influence of production deviations of individual coil parameters from their design specifications on the fringe field can be largely eliminated through suitable selection of the currents flowing in the additional current paths. The fringe field values of the magnet assembly aimed for in the design can always be maintained irrespective of production tolerances of some coil parameters. In an inventive magnet assembly always those fringe field criteria remain optimized which are intended to be optimized by the design—irrespective of production tolerances of certain coil parameters.

We claim:

1. A magnet system for generating a magnetic field (H) in a direction of a z axis in a working volume (AV) disposed on the z axis about z=0, wherein the magnetic field (H) of the magnet system can be expanded along the z axis about z=0 in a polynomial in z having coefficients Hn, the system comprising:

a radially inner partial coil system (C1);

a radially outer partial coil system (C2) disposed coaxially with respect to said radially inner system, said inner and outer coil system having magnetic dipole moments in an operating state of opposite signs and differing by an amount $\Delta_m$ with $|\Delta_m|<2.5\%$ of a magnitude of a magnetic dipole moment of said radially inner partial coil system, said inner and said outer coil system being parts of an actively shielded superconducting magnet coil system (M);

an external device for current supply; and at least one current path (P1, . . . , Pn) which is superconductingly closed in an operating state, said current paths (P1, . . . , Pn) each being charged, in an operating state, by said external current supply device with a respective current (IP1, . . . IPn), wherein said current paths (P1, . . . Pn) have an overall contribution to the magnetic field (H) of the magnet system in the operating state in the working volume (AV) of the magnet system of an amount which is less than 5% of a field contribution of said magnet coil system (M) in the operating state, wherein, when optimizing a fringe field behavior outside of the magnet system, an overall magnitude of magnetic dipole moments of said current paths (P1, . . . , Pn) charged to their respective operating currents (IP1, . . . , IPn) is at least 0.1% of a magnitude of a magnetic dipole moment of a charged said outer partial coil system (C2), wherein, when charging said current paths (P1, ..., Pn) to their respective operating current (IP1, ..., IPn), a resulting change $\Delta_{H2}$ of a coefficient of second order (H2) of the polynomial expansion of the magnetic field (H) of the magnet system is given by:

$$|\Delta_{H2}| < \max(0.25 T/m^2, 0.9 \cdot |H2(M)|),$$

wherein H2(M) designates the coefficient of second order of the polynomial expansion of the magnetic field of said actively shielded superconducting magnet coil system (M) in the operating state.

2. The magnet system of claim 1, wherein $|\Delta_m| < 1\%$ of a magnitude of a magnetic dipole moment of said inner partial coil system (C1).

3. The magnet system of claim 1, wherein the magnet system is part of an apparatus for high-resolution magnetic resonance spectroscopy.

4. The magnet system of claim 1, further comprising a further superconducting coil system which serves as a superconducting Z2 shim in the magnet system and whose contribution to the magnetic field (H) of the magnet system largely eliminates a coefficient of second order (H2) of the polynomial expansion of the magnetic field (H) of the magnet system in the operating state.

5. The magnet system of claim 1, wherein said current paths (P1, ..., Pn) are largely inductively decoupled from said actively shielded superconducting magnet coil system (M).

6. The magnet system of claim 1, wherein at least one of said superconductingly short-circuited current paths (P1, ..., Pn) is also part of a device which compensates for external magnetic field fluctuations in the operating state of the magnet system.

7. The magnet system of claim 1, wherein at least one of said current paths (P1, ..., Pn) is thermally decoupled from said actively shielded superconducting magnet coil system (M).

8. The magnet system of claim 7, wherein an amount of heat transferred to said thermally decoupled current path in case of a quench of said actively shielded superconducting magnet coil system (M) is not more than fifty percent of an amount of heat required to trigger a quench said thermally decoupled current path.

9. The magnet system of claim 1, wherein at least one of said current paths (P1, ..., Pn) comprises magnet coils having a radius which is at least 90% of a radius of outermost coils of said actively shielded superconducting magnet coil system (M).

10. The magnet system of claim 1, wherein at least one of said current paths (P1, ..., Pn) comprises coils which are wound on a coil support, said coil support also bearing coils of said outer partial coil system (C2) of said actively shielded superconducting magnet coil system (M).

11. The magnet system of claim 1, wherein an overall contribution of said current paths (P1, ..., Pn) to the magnetic field (H) of the magnet system in the operating state within the working volume (AV) of the magnet assembly is negligibly small.

12. The magnet system of claim 1, wherein at least one of said current paths (P1, ..., Pn) generates a magnetic field in the operating state which is asymmetric relative to a plane perpendicular to the z axis and intersecting same at z=0.

* * * * *